United States Patent [19]
Alberts et al.

[11] 3,959,047
[45] May 25, 1976

[54] METHOD FOR CONSTRUCTING A ROM FOR REDUNDANCY AND OTHER APPLICATIONS

[75] Inventors: Gene Stoddard Alberts, Essex Junction; Paul Alden Farrar, South Burlington; Robert Lee Hallen, Essex Junction, all of Vt.

[73] Assignee: International Business Machines Corporation, Armonk, N.Y.

[22] Filed: Sept. 30, 1974

[21] Appl. No.: 510,667

[52] U.S. Cl. .................... 156/8; 29/576 R; 156/18; 427/89;91
[51] Int. Cl.² .................................... C23F 1/02
[58] Field of Search ............ 156/8, 11, 17, 18; 29/576, 577, 589; 427/88, 89, 91

[56] References Cited
UNITED STATES PATENTS

| | | | |
|---|---|---|---|
| 3,430,104 | 2/1969 | Burgess et al. | 148/187 X |
| 3,697,318 | 10/1972 | Feinberg et al. | 156/17 X |
| 3,740,523 | 6/1973 | Cohen et al. | 156/2 X |
| 3,780,320 | 12/1973 | Dorler et al. | 357/15 X |

OTHER PUBLICATIONS

IBM Technical Discosure Bulletin, Vol. 14, No. 7, Dec. 1971, Integrated Magnetic Memory Structure, W. B. Archey et al., pp. 1977 and 1978.
IBM Technical Disclosure Bulletin, Vol. 16, No. 4, Sept. 1973, Passivated Refractory Gate Field Transistor by J. R. Gardiner et al., pp. 1064 & 1065.

Primary Examiner—William A. Powell
Attorney, Agent, or Firm—Daniel E. Igo

[57] ABSTRACT

Disclosed is an improved method for manufacturing semiconductor integrated circuitry whereby interconnection pad limiting metallurgy and read only fusible link memory structure is simultaneously formed by first blank depositing a composite metal film followed by in situ forming pad metallurgy and said read only link structure utilizing photoresist and etch techniques. Said read only memory link structure is utilized for directing the use of redundant lines in place of defective array bits.

10 Claims, 1 Drawing Figure

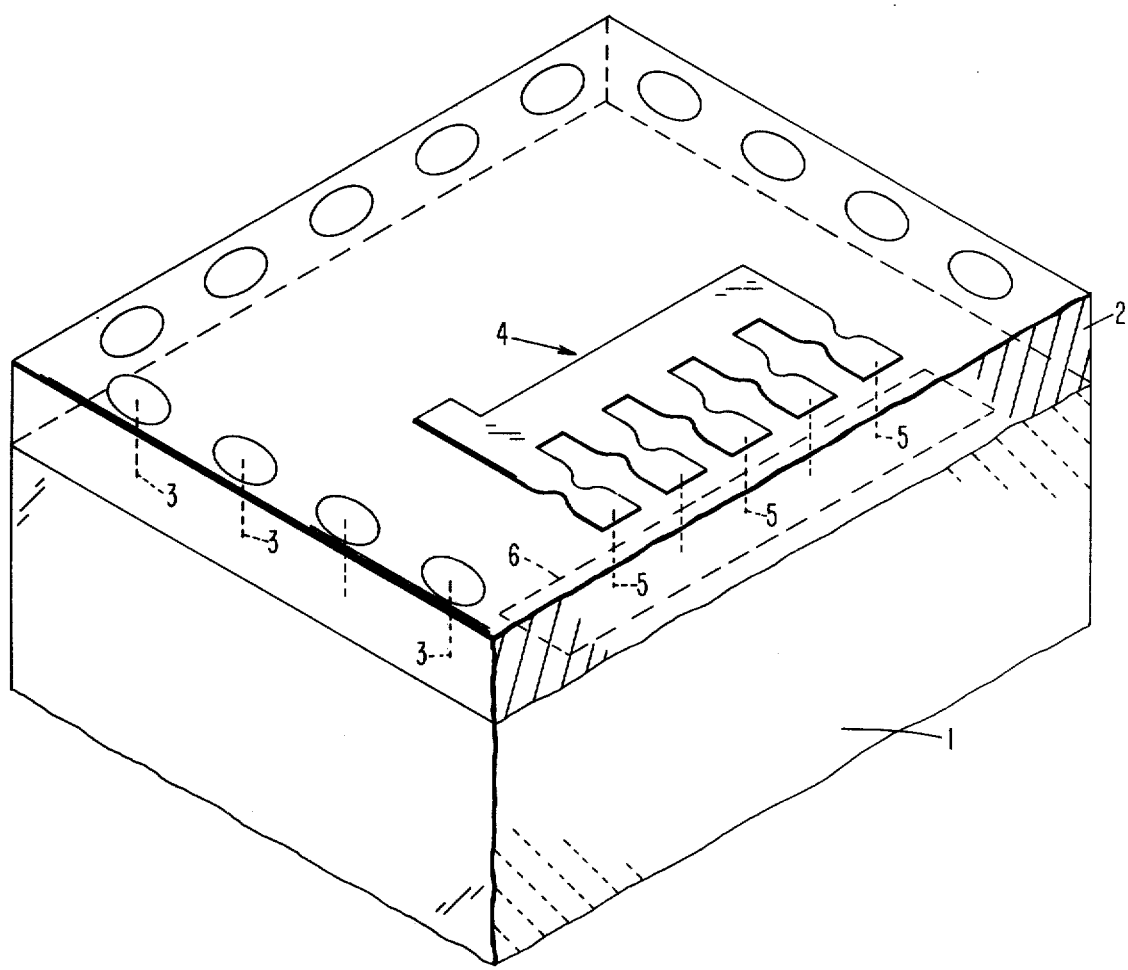

METHOD FOR CONSTRUCTING A ROM FOR REDUNDANCY AND OTHER APPLICATIONS

BACKGROUND OF THE INVENTION

1. Field of The Invention

This invention relates to a memory storage system and more particularly to a memory storage system capable of operating in a reliable manner. More particularly the invention pertains to a method for forming a read only fusible link memory structure embodied in an integrated circuit structure including Field Effect Transistor cells whereby said read only memory is capable of directing utilization of redundant lines in place of defective memory array bits for information storage. The invention is further especially applicable to integrated memory circuit structures comprising field effect transistors serially connect to a capacitor, one plate of which is a current flow electrode and a second plate is a superimposed conducting means acting dually as a capacitor plate and field shield as more particularly described in application Ser. No. 320,394 filed Jan. 2, 1973 and commonly owned by the assignee of this application.

2. Description Of The Prior Art

Many techniques have been advanced for causing by-pass connections to be established automatically around defective bit cells during normal operation of the memory system or automatically performing some equivalent corrective operation without interrupting the fixed memory circuit. One such technique provides a means for storing the address in an auxiliary memory location within a section of the defective memory location provided room or space is available therein. In this technique the defective memory location is tagged and when the latter is read out the computer which employs such a defective memory location can immediately go to the address, stored in the memory, to bring forth a corrected word from an auxiliary memory.

Another procedure embodies dividing each word line of a bulk memory into a large number of subword cells for replacement purposes and employing a memory for registering the location of the defective word cell groups in the bulk memory as well as for registering the location of alternative subword cell groups in the replacement memory in this way compensating for all bad bits expected to occur in the bulk memory by providing a replacement memory which has a bit storage capacity equal to the expected number of bad bits.

Similarly an indirect memory addressing means may be used through the use of large read only memory in which there is one bit word for each main memory word.

U.S. Pat. No. 3,753,244 relating to yield enhancement redundancy discloses a memory storage system utilizing a plurality of storage devices each of which contains redundancy and each of which is functionally organized for example on a single semiconductor chip with its own decoders. This redundancy in each device is provided by placing an extra line of cells on the chip together with a defective address store and a comparator circuit for disabling a defective line of cells and replacing it with the extra line of cells.

United States pending patent application Ser. No. 320,394, Garnache et al, filed Jan. 2, 1973 now U.S. Pat. No. 3,841,926 and Smith, U.S. Pat. No. 3,811,076 owned by this common assignee disclose an integrated circuit process and structure wherein very precise alignment tolerances may be achieved with an essentially planar structure without using a self-aligned gate process and wherein the instant invention is applicable.

In order to meet the demands of large capacity memory application, memory integrated circuits must be highly dense and fabricated with ease and economy. A particular method for producing such an integrated circuit is described in aforesaid pending application and patent wherein integrated circuits of high density are fabricated in a simplified process which allows both the use of multiple conducting layers in a dielectric above a semiconductor substrate, such as a polycrystalline silicon (polysilicon) field shield and metal interconnection lines while also making provision for very precise alignment of subsequent layers to diffusions. A doped oxide containing a suitable dopant, such as arsenic in the case of a p-type silicon substrate, is deposited on the substrate. A pattern corresponding to the desired diffusions is generated by normal photolithographic and etching techniques. A second, undoped oxide layer is thermally grown over the semiconductor substrate and the remaining doped oxide, with dopant from doped oxide simultaneously diffusing into areas of the substrate underlying the doped oxide. The undoped oxide serves to prevent autodoping. Thermally growing the undoped oxide layer converts a layer of the semiconductor surface not covered by doped oxide to the undoped oxide. Both oxide layers are then removed, leaving slight steps at the surface of the semiconductor substrate around the diffusion. The slight steps serve to allow very precise alignment of masks for subsequent process steps. Otherwise, the structure produced is very planar. An insulating layer, desirably a composite of silicon dioxide and silicon nitride in the case of a silicon substrate, is then formed on the substrate, followed by a layer of polycrystalline semiconductor, desirably doped to provide high conductivity. Openings are then etched in the polycrystalline semiconductor layer to allow formation of gate electrodes of FET's contact to the substrate, and contact of a subsequent interconnection metallization to diffusions in some of the circuits. A second insulating layer, such as silicon dioxide, is then grown on the polycrystalline semiconductor layer. Contact holes are then made to diffusions in the substrate, the substrate itself, and the polycrystalline silicon. The deposition and etching of an interconnection layer on the second insulating layer completes fabrication of the integrated circuit.

Monolithic integrated semiconductor structures having a plurality of functionally isolated individual cells that are electrically connected to provide a memory array have been described in U.S. Pat. No. 3,508,209 to B. Agusta et al and U.S. Pat. No. 3,222,653 shows a means for storing the address of an auxiliary memory location within a section of the defective memory location itself. The defective memory location is tagged and when the latter is read out, the computer which employs such a defective memory can immediately go the address, stored in the memory, to bring a corrected word from an auxiliary memory.

Arrangements for storing information which identifies bad and spare lines is known. One method embodies personalizing a semiconductor chip after final metallization by providing metal bridges which are selectively removed for example by selective etching techniques.

Semiconductor structures consists of semiconductor body and semiconductor devices formed in said body.

A lead structure is formed on the body and makes contact with the devices formed in the body. After formation of active devices in a semiconductor structure and the provision of interconnection metal pads environmental protection or passivation is provided by an overlay film of glass through which conventional via holes are formed for interconnection to previously formed metal pads through and into which interconnection metal is deposited using a conventional mask to form pad limiting metallurgy.

SUMMARY OF THE INVENTION

It is an object of the present invention to provide a method for the formation of read only memory circuit configurations on microminiature monolithic semiconductor bodies.

It is a further object of this invention to provide a method for simultaneously producing read only memory structures and pad limiting interconnection metallurgy structures.

The above and other objects are accomplished by evaporating or otherwise providing a blanket composite metal coating upon a semiconductor structure and simultaneously forming, using conventional masking or other techniques, pad limiting metallurgy configurations and metallic circuit configuration suitable for use in redundancy application in selection of appropriate non defective devices in a semiconductor body structure.

The foregoing and other objects, features and advantages of the invention will be apparent from the following more particular description of a preferred embodiment of the invention as illustrated in the accompanying drawing.

DESCRIPTION OF DRAWING

The single FIGURE drawing is an isometric illustration of a semiconductor structure having a bodying incorporating semiconductor devices integrated and interconnected.

DESCRIPTION OF PREFERRED EMBODIMENT

Referring now to the drawing wherein is illustrated a microminiature semiconductor chip device having a body region 1 of semiconductor material and a passivating or environmental protection layer 2. It is desirable to interconnect semiconductor devices previously formed in the semiconductor body. This is accomplished in accordance with conventional fashion by providing terminal vias 3 around the periphery of the passivating layer 2 down to circuitry (not shown) on the semiconductor substrate body 1. Pad limiting metallurgy 4 is provided in the vias as well as a link pattern 4 on the surface of said passivating layer. Link vias 5 connect this metallization pattern 4 to access circuits 6 on the surface of the semiconductor substrate and which are used to access memory or other circuits (not shown) also on the surface of said substrate.

It is the method for simultaneously forming said pading limiting via metallurgy and the metallic link pattern that is the object of the subject invention.

In fabricating semiconductor structures having read only memory structures useful in connecting redundancy circuits and disconnecting defective devices or circuits a passivating layer of silicon dioxide is formed over the device structure where the semiconductor material utilized is silicon. Via passages or holes are then provided through this layer for connection to lower level interconnection metallic pads. Formation of the passivating layer may be accomplished by sputtering or any other conventional means. Vias are usually formed by etching with photolighography masking all of which are well known in the art.

Conventionally pad limiting metallurgy is deposited by vacuum evaporation through a metal mask. This pad limiting metallurgy may be a composite of chromium, copper and gold. Chromium deposit establishes an excellent glass to metal seal and insures environmental protection in the contact area. Copper and gold deposits permit metals to be adhered to the chromium sealing film.

However, in accordance with this invention it is believed advantageous to form the read only links and pad limiting metallurgy simultaneously. This is accomplished by carrying out a blanket vacuum evaporation of the metal composite such as chromium, copper and gold which will form both pad limiting metallurgy and read only structure. Having made said blanket vacuum evaporation sequentially of chromium, copper and gold and utilizing conventional photoresist and etching steps pad limiting metallurgy and read only link structure is easily formed. This procedure eliminates the use of conventional metal masking and avoids the inherent alignment and accuracy tolerances associated with the conventional technique.

Blanket vacuum deposition of a metal composite such as chromium, copper, gold usually requires a silicon dioxide passivating layer temperature of about 150°C. This temperature promotes improved adhesion of the metal to the silicon dioxide film. The link structure has a desirable width of between 3/10,000 to 7/10,000 inch, a length of about 5/1,000 inch. Metal thicknesses are best at 800 angstroms for chromium, a chromium-copper overlap of 500 angstroms, a copper thickness of about 9,000 angstroms and a gold thickness of about 1,400 angstroms. If, however, polyimide is used as a passivation layer or a dual passivation of polyimide over quartz is used the Cr-Cu-Au deposition temperature should be about 250°C. and the metal thicknesses preferred are 750 angstroms of chromium a chromium-copper overlap of 500 angstroms, a copper thickness of of about 16,500 angstroms and a gold thickness of about 2,200 angstroms. Well known metal evaporation control and rate monitoring accomplish these ultimate conditions in carrying out the process steps. Number of via holes and the extent of link structure will vary from each semiconductor chip to another dependent on the scope and extent as well as complexity of circuitry.

In the use of memory circuits in the integrated circuit chip are tested to identify defective circuits, if any. Probes are connected to the link pattern for the purpose of blowing fuse areas and connect redundant memory or other circuits in their place to accessing circuitry. In accordance with the above parameters of 6-volt DC power supply may be used to blow the link fuse area.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In a method for manufacture of integrated semiconductor structure the improvement comprising blanket depositing a composite metal film upon a passivating film of said structure followed by simultaneously forming interconnecting pad limiting via metallization and a redundancy read only metal link pattern thereon.

2. A method in accordance with claim 1 wherein said composite metal film is a successive depositing of chromium, copper and gold.

3. A method in accordance with claim 1 wherein said semiconductor structure is formed of silicon.

4. A method in accordance with claim 1 wherein said passivating film is silicon dioxide.

5. A method in accordance with claim 1 wherein said passivating film is polyimide.

6. A method in accordance with claim 1 wherein said passivating film is a composite layer of quartz and polyimide.

7. A method in accordance with claim 2 wherein said composite metal film is vacuum deposited.

8. A method in accordance with claim 1 wherein said link structure has a width of 3/10,000 inch to 7/10,000 inch and a length of about 5/1,000 inch.

9. A method in accordance with claim 1 wherein said composite metal link structure comprises 750 angstroms thickness chromium, 500 angstroms of Cr-Cu-Au, 16,500 angstroms copper, 2,200 angstroms gold and is deposited on a passivating film which is a composite of polyimide over quartz with said deposition at approximately 250°C.

10. A method in accordance with claim 1 wherein said composite metal link structure comprises 800 angstroms thickness chromium, 9,000 angstroms copper and 1,400 angstroms gold.

* * * * *